(12) United States Patent
Besser et al.

(10) Patent No.: US 6,444,567 B1
(45) Date of Patent: Sep. 3, 2002

(54) PROCESS FOR ALLOYING DAMASCENE-TYPE CU INTERCONNECT LINES

(75) Inventors: Paul R. Besser, Austin, TX (US); Darrell M. Erb, Los Altos, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/477,822

(22) Filed: Jan. 5, 2000

(51) Int. Cl.[7] .......................................... H01L 21/4763
(52) U.S. Cl. ...................... 438/625; 438/626; 438/629; 438/631; 438/633; 438/637; 438/645; 438/650; 438/660; 438/661; 438/663; 438/669; 438/672; 438/687
(58) Field of Search ................................ 438/625, 626, 438/629, 631, 633, 637, 645, 650, 660, 661, 663, 669, 672, 687

(56) References Cited

U.S. PATENT DOCUMENTS

| | | | |
|---|---|---|---|
| 4,335,506 A | | 6/1982 | Chiu et al. ...................... 29/591 |
| 4,789,648 A | | 12/1988 | Chow et al. ................. 437/225 |
| 5,424,246 A | | 6/1995 | Matsuo et al. ............... 437/192 |
| 6,001,736 A | | 12/1999 | Kondo et al. ................ 438/677 |
| 6,022,808 A | | 2/2000 | Nogami et al. ............. 438/694 |
| 6,096,648 A | * | 8/2000 | Lopatin et al. .............. 438/687 |
| 6,147,000 A | * | 11/2000 | You et al. .................... 438/687 |
| 6,147,408 A | * | 11/2000 | Ogure et al. ................. 257/762 |
| 6,160,315 A | * | 12/2000 | Chiang et al. ............... 257/762 |
| 6,172,421 B1 | * | 1/2001 | Besser et al. ................ 257/751 |
| 6,181,013 B1 | * | 1/2001 | Liu et al. ..................... 257/762 |
| 6,194,307 B1 | * | 2/2001 | Chen et al. .................. 438/626 |

* cited by examiner

Primary Examiner—John F. Niebling
Assistant Examiner—Lynne A Gurley

(57) ABSTRACT

The reliability and elecrtromigration resistance of planarized metallization patterns, e.g., of copper, in-laid in the surface of a layer of dielectric material, are enhanced by a process comprising blanket-depositing on the planarized, upper surfaces of the metallization features and the dielectric layer at least one thin layer comprising at least one alloying element for the metal of the features, and then uniformly diffusing at least a minimum amount of the at least one thin layer for a minimum depth below the upper surfaces of the metallization features to effect alloying therewith. The alloyed portions of the metallization features advantageously reduce electromigration therefrom. Planarization, as by CMP, may be performed subsequent to diffusion/alloying to remove any remaining elevated, alloyed or unalloyed portions of the at least one thin layer. The invention finds particular utility in "back-end" metallization processing of high-density integrated circuit semiconductor devices having sub-micron dimensioned metallization features.

20 Claims, 2 Drawing Sheets

PROCESS FOR ALLOYING DAMASCENE-TYPE CU INTERCONNECT LINES

CROSS-REFERENCE TO RELATED APPLICATION

This application contains subject matter related to subject matter disclosed in co-pending U.S. patent application Ser. No. 09/477,821, filed on Jan. 5, 2000.

FIELD OF THE INVENTION

The present invention relates to electrical devices, e.g., semiconductor integrated circuit devices, having in-laid ("damascene"-type) metallization patterns, e.g., interconnection lines, etc., and to a method for minimizing, or substantially preventing, deleterious electromigration of the metallic element(s) of the metallization pattern. More specifically, the present invention relates to semiconductor devices comprising copper (Cu) interconnection patterns and is the manufacture of high speed integrated circuits having sub-micron dimensioned design features and high electrical conductivity interconnect structures.

BACKGROUND OF THE INVENTION

The present invention relates to a method for forming metal films as part of metallization processing of particular utility in the manufacture of electrical and electronic devices, e.g., circuit boards and semiconductor integrated circuits, and is especially adapted for use in processing employing "in-laid" or "damascene"-type technology.

The escalating requirements for high density and performance associated with ultra-large scale integration (ULSI) semiconductor device wiring are difficult to satisfy in terms of providing sub-micron-sized (e.g., 0.18 μm and under), low resistance-capacitance (RC) time constant metallization patterns, particularly wherein the sub-micron-sized metallization features, such as vias, contact areas, lines, etc. require grooves, trenches, and other shaped openings or recesses having very high aspect (i.e., depth-to-width) ratios due to microminiaturization.

Semiconductor devices of the type contemplated herein typically comprise a semiconductor wafer substrate, usually of doped monocrystalline silicon (Si) or, in some instances, gallium arsenide (GaAs), and a plurality of sequentially formed interlayer dielectrics and electrically conductive patterns formed therein and/or therebetween. An integrated circuit is formed therefrom containing a plurality of patterns of conductive lines separated by interwiring spacings, and a plurality of interconnect lines, such as bus lines, bit lines, word lines, and logic interconnect lines. Typically, the conductive patterns of vertically spaced-apart metallization layers or strata are electrically interconnected by a vertically oriented conductive plug filling a via hole formed in the inter-layer dielectric layer separating the layers or strata, while another conductive plug filling a contact area hole establishes electrical contact with an active device region, such as a source/drain region of a transistor, formed in or on the semiconductor substrate. Conductive lines formed in groove- or trench-like openings in overlying inter-layer dielectrics extend substantially parallel to the semiconductor substrate. Semiconductor devices of such type fabricated according to current technology may comprise five or more layers or strata of such metallization in order to satisfy device geometry and microminiaturization requirements.

Electrically conductive films or layers of the type contemplated for use in e.g., "back-end" semiconductor manufacturing technology for fabricating devices having multi-level metallization patterns such as described supra, typically comprise a metal such as titanium (Ti), tantalum (Ta), tungsten (W), aluminum (Al), chromium (Cr), nickel (Ni), cobalt (Co), silver (Ag), gold (Au), copper (Cu) and their alloys. In use, each of the enumerated metals presents advantages as well as drawbacks. For example, Al is relatively inexpensive, exhibits low resistivity, and is relatively easy to etch. However, in addition to being difficult to deposit by lower cost, lower temperature, more rapid "wet" type technology such as electrodeposition, step coverage with Al is poor when the metallization features are scaled down to sub-micron size, resulting in decreased reliability of interconnections, high current densities at certain locations, and increased electromigration. In addition, certain low dielectric constant materials, e.g., polyamides, when employed as dielectric inter-layers, create moisture/bias reliability problems when in contact with Al.

Copper (Cu) and Cu-based alloys are particularly attractive for use in large scale integration (LSI), very large-scale integration (VLSI), and ultra-large scale (ULSI) semiconductor devices requiring multi-level metallization systems for "back-end" processing of the semiconductor wafers on which the devices are based. Cu- and Cu alloy-based metallization systems have very low resistivities, i.e., significantly lower than that of W and even lower than those of previously preferred systems utilizing Al and its alloys, as well as a higher (but not complete) resistance to electromigration. Moreover, Cu and its alloys enjoy a considerable cost advantage over a number of the above-enumerated metals, notably Ag and Au. Also, in contrast to Al and the refractory-type metals (e.g., Ti, Ta, and W), Cu and its alloys can be readily deposited at low temperatures in good quality, bright layer form by well-known "wet" plating techniques, such as electroless and electroplating techniques, at deposition rates fully compatible with the requirements of device manufacturing throughput.

Electroless plating of Cu generally involves the controlled auto-catalytic deposition of a continuous film of Cu or an alloy thereof on a catalytic surface by the interaction of at least a Cu-containing salt and a chemical reducing agent contained in a suitable solution, whereas electroplating comprises employing electrons supplied to an electrode (comprising the surface(s) to be plated) from an external source (i.e., a power supply) for reducing Cu ions in solution and depositing reduced Cu metal atoms on the plating surface(s). In either case, a nucleation/seed layer is required for catalysis and/or deposition on the types of substrates contemplated herein. Finally, while electroplating requires a continuous nucleation/seed layer, very thin and discontinuous islands of a catalytic metal may be employed with electroless plating.

As indicated above, a commonly employed method for forming "in-laid" metallization patterns as are required for "back-end" metallization processing of semiconductor wafers employs "damascene"-type technology. Generally, in such processing methodology, a recess (i.e., an opening) for forming, e.g., a via hole in a dielectric layer for electrically connecting vertically separated metallization layers, or a groove or trench for a metallization line, is created in the dielectric layer by conventional photolithographic and etching techniques, and filled with a selected metal. Any excess metal overfilling the recess and/or extending over the surface of the dielectric layer is then removed by, e.g., chemical-mechanical polishing (CMP), wherein a moving pad is biased against the surface to be polished/planarized, with the interposition of a slurry containing abrasive particles (and other ingredients) therebetween.

A variant of the above-described technique, termed "dual damascene" processing, involves the formation of an opening comprising a lower contact or via hole section in communication with an upper groove or trench section, which opening is filled with a conductive material, typically a metal, to simultaneously form a conductive via plug in electrical contact with a conductive line.

Referring now to FIG. 1, schematically shown therein in simplified cross-sectional view, is a conventional damascene-type processing sequence employing relatively low cost, high manufacturing throughput plating and CMP techniques for forming recessed "back-end" metallization patterns (illustratively of Cu-based metallurgy but not limited thereto) in a semiconductor device formed in or on a semiconductor wafer substrate 1. In a first step, the desired arrangement of conductors is defined as a pattern of recesses 2 such as via holes, grooves, trenches, etc. formed (as by conventional photolithographic and etching techniques) in the surface 4 of a dielectric layer 3 (e.g., a silicon oxide and/or nitride or an organic polymeric material) deposited or otherwise formed over the semiconductor substrate 1. In a second step, a layer of Cu or Cu-based alloy 5 is deposited by conventional plating techniques, e.g., electroless or electroplating techniques, to fill the recesses 2. In order to ensure complete filling of the recesses, the Cu-containing layer 5 is deposited as a blanket (or "overburden") layer of excess thickness t so as to overfill the recesses 2 and cover the upper surface 4 of the dielectric layer 3. Next, the entire excess thickness t of the metal overburden layer 5 over the surface of the dielectric layer 3 is removed by a CMP process utilizing an alumina ($Al_2O_3$)-based slurry, leaving metal portions 5' in the recesses 2 with their exposed upper surfaces 6 substantially co-planar with the surface 4 of the dielectric layer 3.

The above-described conventional damascene-type process forms in-laid conductors 5' in the dielectric layer 3 while avoiding problems associated with other types of metallization patterning processing, e.g., blanket metal layer deposition, followed by photolithographic masking/etching and dielectric gap filling. In addition, such single or dual damascene-type processing can be performed with a variety of other types of substrates, e.g., printed circuit boards, with and/or without intervening dielectric layers, and with a plurality of metallization levels, i.e., five or more levels.

A drawback associated with Cu-based "back-end" metallization is the possibility of Cu diffusion into adjacent structures, e.g., an underlying semiconductor substrate (typically Si) or a dielectric layer, resulting in degradation of semiconductive or insulative properties, as well as poor adhesion of the deposited Cu or Cu alloy layer to various materials employed as dielectric inter-layers, etc. As a consequence of these phenomena associated with Cu-based metallurgy, it is generally necessary to provide an adhesion promoting and/or diffusion barrier layer intermediate the semiconductor substrate and the overlying Cu-based metallization layer. Suitable materials for such adhesion/barrier layers include, e.g., Ti, W, Cr, Ta, and TaN.

Another drawback associated with the use of Cu or Cu-based metallurgy for "back-end" metallization processing of semiconductor devices, results from the undesirable formation of copper oxide(s), e.g., $Cu_2O$, $CuO$, $CuO_2$, etc., on the planarized Cu or Cu-based alloy surfaces of the in-laid metallization features as a result of oxidation, etc., due to the strong chemical oxidizing agents conventionally included in CMP slurries for enhancing Cu dissolution/removal rates or as a result of exposure of the freshly abraded Cu-based surfaces to an oxidizing atmosphere, e.g., air or oxygen. The thickness of the copper oxide layer can vary depending upon the particular CMP processing conditions, e.g., stronger oxidizing agents contained in the CMP slurry result in thicker oxide layers, as does increased duration of exposure of freshly abraded, post CMP Cu surfaces to oxidizing atmospheres, e.g., air.

Copper oxide-containing layer(s), when formed as described above, disadvantageously increase contact resistance and reduce or prevent adhesion of layers thereto, e.g., silicon nitride-based capping layers. Moreover, the copper oxide layers are brittle, increasing the likelihood of circuit disconnect or reduced conductivity due to separation, as by peeling, of the copper oxide layer from conductor layers in contact therewith. Yet another disadvantage attributable to the presence of copper oxide at the interface between adjacent electrical conductors results from the rapid diffusion of Cu atoms and/or ions along the oxide layer. The latter characteristic of copper oxide layers disadvantageously results in enhanced material transport during electrical current flow and thus increases the electromigration rate of Cu atoms and/or ions along Cu-based conductor lines.

Electromigration occurs in extended runs or lengths of metal conductor lines carrying significant currents. According to a conventional theory for explaining the mechanism of electromigration, the current flow within the conductor line can be sufficient to result in movement of Cu atoms and/or ions along the line via momentum transfer engendered by collision of the Cu atoms and/or ions with energetic, flowing electrons. The current flow also creates a thermal gradient along the conductor length which increases the mobility of the metal ions and/or atoms. As a consequence of the momentum transfer and the thermally enhanced mobility, metal (Cu) ions and/or atoms diffuse in the direction of the gradient, and metal (Cu) loss at the source end of the conductor eventually results in thinning of the conductor line. The electromigration effect can continue until the conductor line becomes so thin that it separates from the current input or forms an open circuit, resulting in circuit (i.e., semiconductor chip) failure. As this usually occurs over an extended period of operation, the failure is often seen by the end-user.

As design rules for high integration density becomes smaller, high speed semiconductor devices extend deeper into the sub-micron range, e.g., about 0.18 $\mu$m and under, e.g., about 0.15 $\mu$m and below, and the number of metallization levels increases, the reliability of the "back-end" interconnection patterns and systems become particularly critical for the obtainment of desired operating characteristics and performance. As is known, Cu electromigration can be reduced by the addition thereto of certain alloying elements, e.g., tin (Sn), boron (B), magnesium (Mg), carbon (C), palladium (Pd), cobalt (Co) nickel (Ni), and cadmium (Cd). However, the use of alloyed Cu according to conventional damascene-type methodology, such as described supra with respect to FIG. 1, is problematic in that the commonly utilized high manufacturing throughput technique for filling the recesses 2 is not amenable for depositing such Cu-based alloys with adequate control of composition and/or uniformity. In addition, formation of appropriately constituted Cu-based alloys by a process comprising electrolessly depositing a seed layer containing the alloying element(s) at the bottom of the recesses and then upwardly diffusing the alloying element(s) into subsequently electroplated unalloyed Cu filling the recesses similarly results in lack of adequate alloy composition uniformity for reliable reduction or mitigation of Cu electro-migration. Moreover, the effectiveness of such techniques depends, in part, on line width; however, inasmuch as line widths are variable, the problem of variation of alloy composition uniformity is further exacerbated.

Thus, there exists a need for metallization process methodology which avoids the above-mentioned drawbacks associated with oxide layer formation, electromigration, poor control of alloy composition resulting in poor alloy uniformity, etc., and which enables formation of metallization members, e.g., interconnect and routing lines, particularly of Cu or Cu-based alloys, having high reliability, high product yield, improved electromigration resistance, and high performance. In particular, there exists a need for eliminating the problems associated with electromigration and oxide layer formation resulting from CMP processing to form "in-laid", "damascene"-type Cu-based metallization patterns. Moreover, there exists a need for improved metallization processing technology which is fully compatible with conventional process flow, methodology, and throughput requirements in the manufacture of integrated circuit semiconductor devices and other devices requiring "in-laid" metallization patterns.

DISCLOSURE OF THE INVENTION

An advantage of the present invention is a method of manufacturing an electrical or electronic device having highly reliable, electromigration-resistant metallization patterns.

Another advantage of the present invention is a method of manufacturing a semiconductor integrated circuit device having highly reliable, electromigration-resistant Cu-based metallization patterns.

Yet another advantage of the present invention is a method of manufacturing "in-laid", "damascene"-type Cu-based metallization patterns having improved reliability, high conductivity, and improved electromigration resistance.

Still another advantage of the present invention is an improved method of forming high-density, "in-laid" metallization patterns by a "damascene"-type, CMP-based process which is fully compatible with existing process methodology for forming integrated circuit semiconductor devices and printed circuit boards.

Additional advantages and other features of the present invention will be set forth in the description which follows and in part will become apparent to those having ordinary skill in the art upon examination of the following or will be learned from the practice of the invention. The advantages of the present invention may be realized and obtained as particularly pointed out in the appended claims.

According to one aspect of the present invention, the foregoing and other advantages are achieved in part by a method of manufacturing an electrical device, the method comprising the sequential steps of:

(a) providing a substrate including at least one damascene-type, metal feature in-laid in the upper, exposed surface of a layer of dielectric material overlying at least a portion of the substrate, the at least one metal feature including an upper, exposed surface substantially co-planar with the upper surface of the layer of dielectric material;

(b) blanket-depositing at least one layer comprising at least one alloying element for the metal feature on the exposed, upper surface of the at least one metal feature and on the surface of the layer of dielectric material;

(c) annealing to substantially uniformly diffuse at least a predetermined minimum amount of the at least one alloying element from the at least one layer comprising the at least one alloying element into the at least one metal feature for at least a minimum depth below the upper surface thereof, whereby electromigration of the metal of the at least one metal feature is minimized or substantially prevented; and (d) removing remaining, alloyed and/or unalloyed portions of the at least one layer comprising at least one alloying element which extend above the upper surface of the layer of dielectric material, thereby making the upper surface of the at least one metal feature substantially co-planar with the upper surface of the dielectric layer.

According to embodiments of the present invention, the method further comprises the step of:

(a') exposing the upper surface of the at least one metal feature to a reducing agent or atmosphere prior to performing step (b).

In accordance with embodiments of the present invention, the electrical device comprises a semiconductor integrated circuit device, and step (a) comprises providing as the substrate a semiconductor wafer of monocrystalline silicon (Si) or gallium arsenide (GaAs) having a major surface, the dielectric layer is formed over at least a portion of the major surface, and the at least one damascene-type, in-laid metal feature comprises a plurality of features of different widths and/or depths for providing vias, interlevel metallization, and/or interconnection lines of at least one active device region or component formed on or within the semiconductor wafer, and the metal of the at least one in-laid metal feature is unalloyed copper (Cu); step (b) comprises blanket-depositing, as by a physical vapor deposition (PVD), e.g., sputtering, ion plating, or vacuum evaporation, at least one layer comprising at least one alloying element selected from the group consisting of: tin (Sn), boron (B), magnesium (Mg), carbon (C), palladium (Pd), cobalt (Co), nickel (Ni), and cadmium (Cd), the at least one layer having a thickness at least sufficient to provide a predetermined minimum concentration of the at least one alloying element of from about 0.1 to about 4 at. % for at least a predetermined minimum depth below the upper surface of the at least one in-laid Cu metal feature; step (c) comprises annealing at a temperature of from about 200° C. to about 450° C. for from about 60 sec. to about 90 min. in an inert atmosphere; and step (d) comprises removing (e.g., by etching or chemical-mechanical polishing (CMP)) the remaining alloyed and/or unalloyed portion(s) of the at least one layer comprising the at least one alloying element which extend(s) above the upper surface of the dielectric layer, thereby making the upper surface of the at least one metal feature substantially co-planar with the upper surface of the dielectric layer.

According to further embodiments of the present invention, step (a') comprises exposing the upper surface of the at least one Cu metal feature to a reducing agent or atmosphere, e.g., a hydrogen plasma, for reducing any copper oxide present thereat, prior to performing step (b); and step (a) for providing the substrate including at least one damascene-type, in-laid metal feature comprises the preliminary steps of:

i. forming a dielectric layer on a surface of a substrate, the dielectric layer having an exposed, upper surface;

ii. forming at least one recess in the exposed, upper surface of the dielectric layer;

iii. depositing a metal layer (e.g., unalloyed Cu) filling the at least one recess and extending over the upper surface of the dielectric layer;

iv. removing the portion(s) of the metal layer extending over the upper surface of the dielectric layer; and v. removing any excess thickness portion(s) of the metal layer filling the at least one recess which extend(s) above the upper surface of the dielectric layer, e.g., by CMP, thereby making the upper surface of the at least one in-laid metal feature substantially co-planar with the upper surface of the dielectric layer.

According to another aspect of the present invention, a method of manufacturing a semiconductor integrated circuit device comprises the sequential steps of:

(a) providing a substrate comprising a semiconductor wafer of monocrystalline Si or GaAs and having a major surface, a dielectric layer formed on at least a portion of the major surface and having an exposed, upper surface, at least one damascene-type, unalloyed Cu metal feature in-laid in the upper surface of the dielectric layer, the at least one Cu metal feature including an exposed, upper surface substantially co-planar with the upper surface of the dielectric layer;

(b) blanket-depositing at least one layer comprising at least one alloying element for the Cu metal feature on the exposed, upper surface of the at least one Cu metal feature and on the exposed, upper surface of the dielectric layer, the at least one alloying element being selected from the group consisting of: Sn, B, Mg, C, Pd, Co, Ni, and Cd;

(c) annealing to substantially uniformly diffuse the at least one layer comprising at least one alloying element into the at least one Cu metal feature for at least a predetermined minimum depth below the upper surface thereof, thereby to minimize or substantially prevent electromigration of Cu atoms and/or ions therefrom, the thickness of the at least one layer comprising the at least one alloying element being sufficient to provide a predetermined minimum concentration thereof of from about 0.1 to about 4 at. % for a predetermined minimum depth of at least about 20 Å below the upper surface of the at least one Cu metal feature; and (d) removing any remaining, alloyed and/or unalloyed portion(s) of the at least one layer comprising the at least one alloying element which extend(s) above the upper surface of the dielectric layer, thereby making the upper surface of the at least one Cu metal feature substantially co-planar with the upper surface of the dielectric layer.

According to embodiments of the present invention, the method further comprises the steps of:

(a') exposing the upper surface of the at least one Cu metal feature to a reducing agent or atmosphere, e.g., a hydrogen plasma, for reducing any copper oxide present thereat prior to performing step (b); and step (c) comprises annealing at a temperature of from about 200° C. to about 450° C. for from about 60 sec. to about 90 min. in an inert atmosphere.

According to further embodiments of the present invention, step (a) comprises providing a semiconductor wafer having a dielectric layer on a major surface thereof which comprises a plurality of in-laid, unalloyed Cu metal features of different widths and/or depths for providing vias, inter-level metallization, and/or interconnection lines of at least one active device region or component formed on or within the semiconductor wafer.

Additional advantages of the present invention will readily become apparent to those skilled in the art from the following detailed description, wherein only the preferred embodiment of the present invention is shown and described, simply by way of illustration of the best mode contemplated for carrying out the method of the present invention. As will be understood, the present invention is capable of other and different embodiments, and its several details are capable of modification in various obvious respects, all without departing from the present invention. Accordingly, the drawing and description are to be regarded as illustrative in nature, and not as limitative.

BRIEF DESCRIPTION OF THE DRAWINGS

The following detailed description of an embodiment of the present invention can best be understood when read in conjunction with the following drawings, in which like reference numerals are employed throughout to designate similar features, wherein.

DESCRIPTION OF THE INVENTION

The present invention addresses and solves problems arising from manufacturing electrical devices comprising in-laid metallization patterns, e.g., semiconductor integrated circuit devices, wherein, as part of the fabrication methodology, a plurality of recesses formed in the surface of a dielectric layer overlying a semiconductor substrate comprising at least one active device region or component are filled with a metal, illustratively Cu, which is subject to electromigration when the device is in use. More specifically, the present invention enables the formation of in-laid metallization patterns, e.g., of Cu-based metallurgy, in which the tendency for electromigration of the principal metallic element or component is minimized or substantially prevented, and which provide good adhesion to and low contact resistance with adjacent metallization patterns and/or levels in contact therewith.

Figure 1:
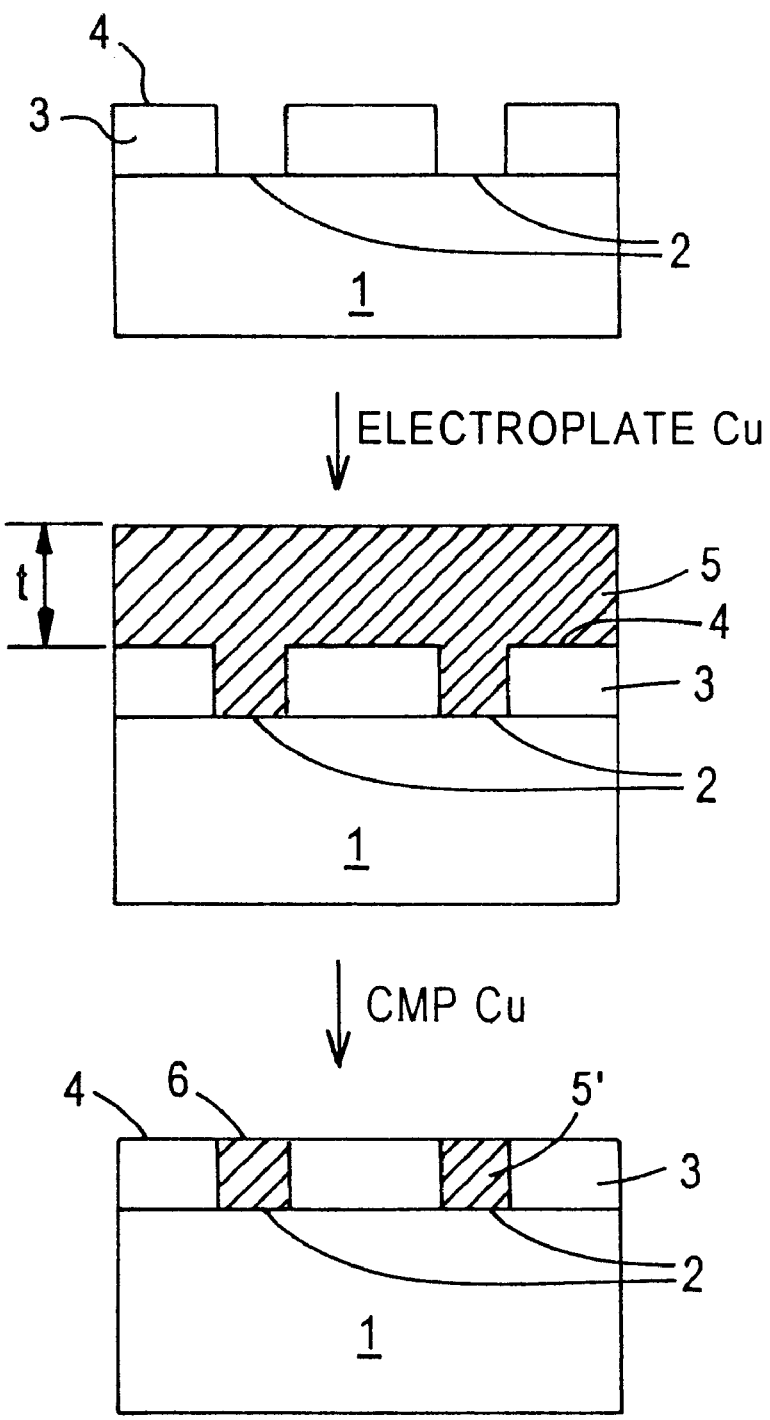
FIG. 1 illustrates, in simplified, cross-sectional schematic form, a sequence of processing steps for forming a pattern of damascene-type, in-laid Cu metallization features according to conventional practices for manufacture of semiconductor integrated circuit devices.

The present invention enables the formation of in-laid metallization patterns comprising metal alloys of well-controlled composition and/or compositional uniformity, by means of techniques which are fully compatible with the requirements of automated manufacturing technology and product throughput. Briefly stated, according to the present invention, conventional damascene-type methodology (such as illustrated in FIG. 1) is employed for forming an in-laid metallization pattern in a dielectric layer overlying a suitable substrate, e.g., a semiconductor wafer comprising at least one active device region or component, by which processing an unalloyed metal, e.g., Cu, is utilized for filling the pattern of recesses in the dielectric layer. Subsequent to planarization processing, as by chemical-mechanical polishing (CMP), and after optional exposure of the metal surface(s) to a reducing atmosphere for removing any deleterious oxide therefrom, at least one thin layer comprising at least one alloying element for the unalloyed metal is blanket-deposited on the exposed, upper surface(s) of the feature(s) of the metallization pattern and [an] the exposed, upper surface of the dielectric layer, and the thus-produced structure subjected to thermal processing, e.g., annealing in an inert atmosphere, to substantially uniformly diffuse into, and alloy with, at least a portion of the metal (e.g., Cu) filling the recess pattern, whereby electromigration of the metal is minimized or substantially prevented. Any excess alloyed and/or unalloyed, elevated portion(s) of the at least one layer comprising at least one alloying element remaining after diffusion/alloying is (are) removed, as by CMP, thereby making the exposed, upper surface of the in-laid metal feature(s) of the metallization pattern substantially co-planar with the exposed, upper surface of the dielectric layer.

An embodiment of the present invention will now be described with reference to FIG. 2, which shows, in simplified, cross-sectional, schematic fashion, an illustrative, but not limitative, embodiment of the present invention comprising a sequence of processing steps performed on a semiconductor wafer substrate-based workpiece produced according to the process sequence illustrated in FIG. 1, wherein similar reference numerals are used throughout to denote similar features. As will be apparent to one of ordinary skill in the art, the inventive process is readily adapted for use in the manufacture of a variety of electrical and electronic devices utilizing in-laid metallization patterns, e.g., printed circuit boards and integrated circuit devices. It should also be recognized that the process steps and structures described below do not necessarily form a complete process flow for manufacturing such devices. However, the present invention can be used in conjunction with conventional technology currently employed in the art, e.g., integrated circuit fabrication methodology, and, consequently, only so much of the commonly practiced process steps are included here as are necessary for an understanding of the present invention. As employed throughout the disclosure and claims, the term "substrate" and/or "semiconductor wafer substrate" includes, e.g., a semiconductor substrate per se or an epitaxial layer formed on a suitable semiconductor substrate. Finally, the drawing figures representing cross-sections of portions of a semiconductor device during fabrication processing are not drawn to scale, but instead are drawn as to best illustrate the features of the present invention.

Figure 2:
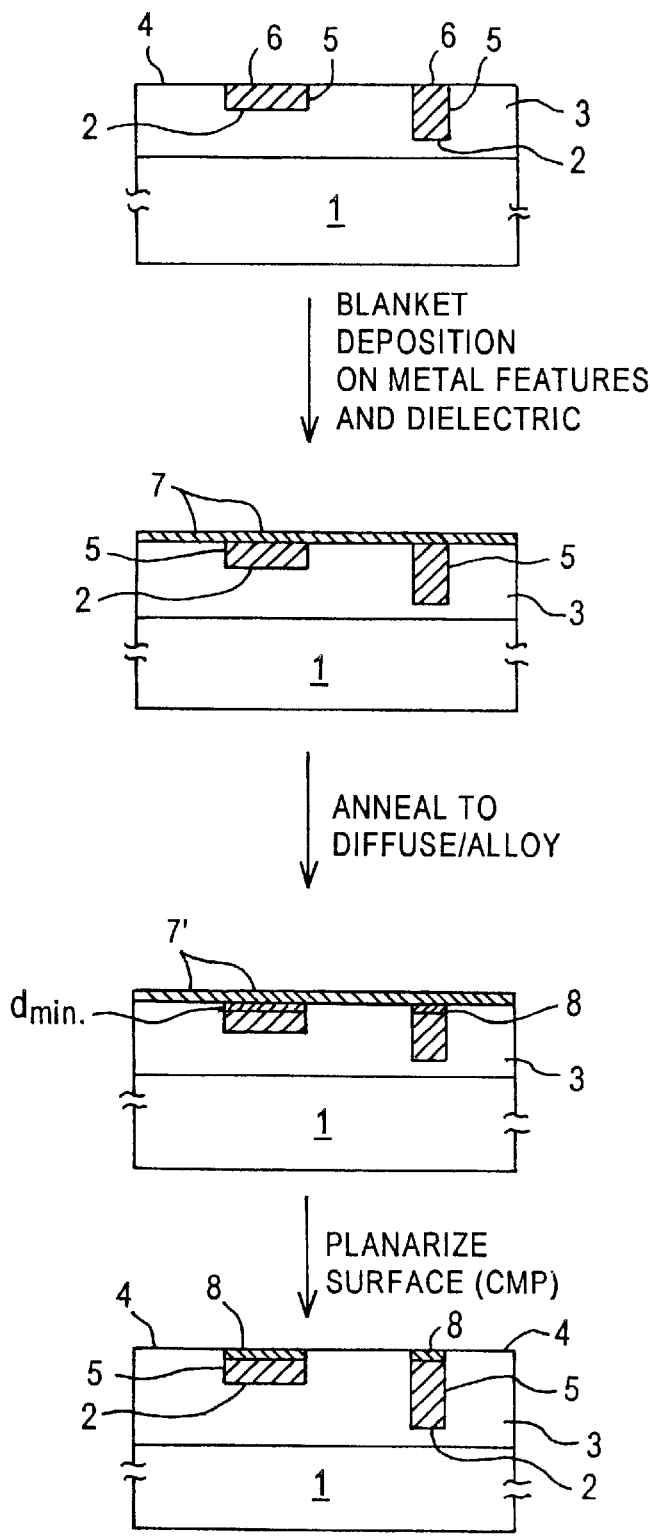
FIG. 2 illustrates, in simplified, cross-sectional schematic form, a sequence of processing steps for alloying the pattern of Cu in-laid metallization features of FIG. 1 according to the inventive methodology.

Referring now to FIG. 2, in a preliminary step according to the present invention, a semiconductor substrate-based workpiece similar to that shown in the third view of FIG. 1 is provided, having a desired in-laid metallization pattern, comprising a semiconductor wafer substrate 1, a dielectric layer 3 overlying substrate 1 and having a plurality of recesses of different widths and/or depths formed in the exposed, upper surface 4 thereof, and a layer 5 of an unalloyed metal, illustratively Cu, filling the recesses 2, the exposed, upper surfaces 6 of the metal being substantially co-planar with the exposed, upper surface 4 of the dielectric layer 3.

In the illustrated structure, semiconductor substrate 1 typically comprises a wafer of monocrystalline Si or GaAs, layer 3 comprises an insulative material typically utilized as an inter-layer dielectric ("ILD"), i.e., an inorganic material such as a silicon oxide, nitride, or oxynitride, or an organic-based or derived material, such as parylene, benzocyclobutene (BCB), etc. Recesses 2 formed in the upper, exposed surface 4 of dielectric layer 3 are utilized for forming vias, inter-level metallization, and/or interconnection routing of at least one active device region or component formed on or within semiconductor wafer substrate 1 and typically include high aspect (i.e., depth-to-width) ratios greater than one, sub-micron or micron-sized dimensions, and sub-micron or micron-sized dimensions, i.e., widths of from about 0.08 to about 3.0 μm and depths of from about 0.4 to about 2.0 μm.

In a first step according to the inventive methodology, at least one thin layer 7 comprising at least one alloying element for the metal 5 of the in-laid metal feature(s) of the metallization pattern is blanket-deposited on the exposed, upper surfaces, 6 and 4, respectively, of the metallization features and the dielectric layer 3, as by a suitable physical vapor deposition (PVD) technique, including, inter alia, sputtering, ion plating, and vacuum evaporation. According to the present invention, the thickness(es) of the at least one thin layer 7 comprising at least one alloying element is (are) sufficient to provide, after a subsequent thermal treatment for effecting diffusion into the underlying metal 5 of the metal feature(s), a predetermined minimum concentration ($c_{min.}$) of the alloying element(s) for a predetermined minimum depth $d_{min.}$ below surface(s) 6 of the metal feature(s), sufficient to substantially reduce or eliminate electromigration of the metal 5 of the metallization feature(s). By way of illustration, but not limitation, in the case of metallization features filled with unalloyed Cu metal 5, a layer 7 of Co from about 50 to about 200 Å thick is sufficient to provide a Cu-Co alloy layer 8 having a substantially uniform, minimum concentration $c_{min.}$ of Co of from about 0.1 to about 4 at. % extending for a minimum depth $d_{min.}$ of from about 20 to about 100 Å below surface 6. Significantly, it is also within the ambit of the present invention to substantially uniformly diffuse the at least one alloying element from the at least one layer 7 into the metal 5 of the metal feature(s) for the entire depth thereof, and therefore form an alloy layer 8 encompassing the entire depth and width extent of the metal feature(s). Given the disclosure and the objective(s) of the present invention, appropriate thicknesses for the at least one alloying element layer 7, as well as alloy depth and concentration, can be determined and optimized for use in a particular application.

Layer 7 can, depending, inter alia, upon the particular metal 5 and choice of alloying element(s), comprises a single layer including one or more alloying elements, e.g., two alloying elements, or alternatively, can comprise two or more overlying layers, each containing a single alloying element. The latter alternative may be preferred when co-deposition of multiple alloying elements in single layer form is impractical or results in poor control of the relative amounts of the alloying elements, and therefore, poor composition control and/or uniformity of the desired alloy.

Referring still to FIG. 2, in the next step according to the inventive methodology, the at least one alloying element layer 7 is subjected to a treatment for effecting diffusion into and alloying with the underlying metal 5 of the metal feature(s), as by a thermal treatment. More specifically, diffusion/alloying can be effected by annealing at an elevated temperature in an inert atmosphere, e.g., nitrogen ($N_2$) or a rare gas such as argon (Ar). By way of illustration, but not limitation, in the case of a layer 7 of Co and underlying metal feature(s) of unalloyed Cu metal 5, diffusion/alloying to provide an alloy layer 8 having a minimum alloying element concentration $C_{min.}$ for a minimum depth $d_{min.}$ below surface 6 as described supra can be provided by annealing in an inert atmosphere at a temperature of from about 200 to about 450° C. for from about 60 sec. to about 90 min. As before, given the disclosure and objective(s) of the present invention, suitable annealing conditions for use with other alloying elements and metal features can be optimized for use in a particular application.

As illustrated in FIG. 2, layer portions 7' which extend above the level of upper surface 4 of dielectric layer 3, composed of alloyed and/or unalloyed components or portions of layer(s) 7 may remain on or over the upper surfaces 6 and 4, respectively, of the alloyed layer portion(s) 8 of the metal feature(s) and the dielectric layer 3 after completion of the diffusion/alloying treatment. In the next step according to the inventive methodology, any such remaining portion(s) 7' is (are) removed, e.g., by etching or chemical-mechanical planarization (CMP), thereby re-establishing co-planarity of the upper surface 6 of the in-laid metal feature(s) and the upper surface 4 of the dielectric layer 3. The thus-produced, planarized, in-laid metallization pattern having alloy layer 8 at the upper surface 6 for minimizing or substantially preventing electromigration therefrom may then be subjected to further "back-end" metallization processing, e.g., adherent formation thereon, as by damascene techniques, of at least one additional layer or strata of in-laid metallization.

In some instances, e.g., as with unalloyed Cu in-laid metal features, a layer comprising at least one copper oxide ($Cu_2O$, CuO, and/or $CuO_2$) may be present on the upper surface(s) 6 of the metal 5 of the metal feature(s) of the workpiece prior to the step for blanket deposition thereon of the at least one layer comprising at least one alloying element, typically as a result of oxidation by oxidants included in the CMP abrasive slurry or by exposure of the freshly abraded surface (s) to an oxidizing atmosphere (e.g., air) after planarization processing. In any event, the copper oxide layer, if present during the selective deposition step, would result, inter alia, in poor adhesion of the at least one alloying layer and impaired diffusion/alloying, and, therefore, must be removed prior to the selective deposition step, as by exposure to a reducing agent or atmosphere. By way of illustration, but not limitation, copper oxide layers on unalloyed Cu metal 5 features may be removed by exposure to a hydrogen plasma for from about 20 to about 90 sec.

The present invention thus provides a simple, convenient, and reliable method for reducing, or substantially preventing, deleterious electromigration of metal from in-laid metallization patterns by introducing at least a minimum concentration of at least one electromigration inhibiting, alloying element into the metallization features for at least a minimum depth below the upper surfaces (top interface) thereof. The present invention enables the formation of extremely reliable interconnect members and patterns, illustratively, but not limited to, Cu, by providing a method for reliably reducing, or substantially preventing, deleterious electromigration. The inventive process also provides a substantial increase in the reliability and adhesion of damascene-type metallization patterns utilized in semiconductor "back-end" processing and is equally applicable to "dual-damascene" type processing.

The inventive methodology enjoys particular utility in the manufacture of semiconductor devices having sub-micron dimensioned metallization features and high aspect ratio openings. Moreover, the inventive method can be practiced at manufacturing rates consistent with the requirements for economic competitiveness, and is fully compatible with conventional process flow for automated manufacture of high-density integration semiconductor devices. In addition, the invention is particularly well suited to the manufacture of circuit boards and other types of electrical and electronic devices and/or components.

In the previous description, numerous specific details are set forth, such as specific materials, structures, reactants, processes, etc., in order to provide a better understanding of the present invention. However, the present invention can be practiced without resorting to the details specifically set forth. In other instances, well known processing materials and techniques have not been described in detail in order not to unnecessarily obscure the present invention.

Only the preferred embodiment of the present invention and but a few examples of its versatility are shown and described in the present disclosure. It is to be understood that the present invention is capable of use in various other combinations and environments and is susceptible of changes or modifications within the scope of the inventive concept as expressed herein.

What is claimed is:

1. A method of manufacturing an electrical device, which method comprises the sequential steps of:
   (a) providing a substrate including at least one damascene-type metal feature in-laid in the upper, exposed surface of a layer of dielectric material overlying at least a portion of said substrate, the at least one metal feature including an upper, exposed surface substantially co-planar with said upper surface of said layer of dielectric material;
   (b) blanket-depositing at least one layer comprising at least one electromigration reducing alloying element for said metal feature on said exposed, upper surface of said at least one metal feature and on said upper surface of said layer of dielectric material;
   (c) annealing to substantially uniformly diffuse at least a predetermined minimum amount of said at least one alloying element from said at least one layer comprising said at least one alloying element into said at least one metal feature for at least a predetermined minimum depth below said upper surface thereof, whereby electromigration of the metal of said at least one metal feature is minimized or substantially prevented; and
   (d) removing any remaining, alloyed and/or unalloyed portion(s) of said at least one layer comprising said at least one alloying element which extend(s) above said surface of said layer of dielectric material, thereby making said upper surface of said at least one metal feature substantially co-planar with said upper surface of said dielectric layer.

2. The method as in claim 1, further comprising the step of:
   (a') exposing said upper surface of said at least one metal feature to a reducing agent or atmosphere prior to performing step (b).

3. The method as in claim 1, wherein:
   step (d) comprises removing any remaining, alloyed and/ or unalloyed portion(s) of said at least one layer comprising at least one alloying element by etching or chemical-mechanical polishing (CMP).

4. The method as in claim 1, wherein said electrical device comprises a semiconductor integrated circuit device, and:
   step (a) comprises providing as said substrate a semiconductor wafer of monocrystalline silicon (Si) or gallium arsenide (GaAs) having a major surface, said dielectric layer is formed over at least a portion of said major surface, and said at least one damascene-type, in-laid metal feature comprises a plurality of features of different widths and/or depths for providing vias, inter-level metallization, and/or interconnection lines of at least one active device region or component formed on or within said semiconductor wafer.

5. The method as in claim 4, wherein:
   said metal of said at least one in-laid metal feature is unalloyed copper (Cu).

6. The method as in claim 5, wherein:
   step (b) comprises blanket-depositing at least one layer comprising at least one alloying element selected from the group consisting of: tin (Sn), boron (B), magnesium (Mg), carbon (C), palladium (Pd), cobalt (Co), nickel (Ni), and cadmium (Cd).

7. The method as in claim 6, wherein:
step (b) comprises blanket-depositing said at least one layer comprising at least one alloying element by a physical vapor deposition (PVD) process.

8. The method as in claim 7, wherein:
step (b) comprises blanket-depositing said at least one layer comprising at least one alloying element by sputtering, ion plating, or vacuum evaporation.

9. The method as in claim 6, wherein:
step (b) comprises blanket-depositing said at least one layer comprising at least one alloying element in a predetermined minimum thickness at least sufficient to provide a predetermined minimum concentration of said at least one alloying element of from about 0.1 to about 4 at. % for at least a predetermined minimum depth below said upper surface of said at least one Cu metal feature.

10. The method as in claim 9, wherein:
step (c) comprises annealing at a temperature of from about 200° C. to about 450° C. for from about 60 sec. to about 90 min. in an inert atmosphere.

11. The method as in claim 9, wherein:
step (d) comprises removing any remaining, alloyed and/or unalloyed portion(s) of said at least one layer comprising at least one alloying element by etching or chemical-mechanical polishing (CMP).

12. The method as in claim 5, further comprising the step of:
(a') exposing said upper surface of said at least one Cu metal feature to a reducing agent or atmosphere for reducing any copper oxide present thereat, prior to performing step (b).

13. The method as in claim 12, wherein:
step (a') comprises exposing said upper surface of said at least one Cu metal feature to a hydrogen plasma.

14. The method as in claim 1, wherein:
step (a) for providing said substrate including at least one damascene-type, in-laid metal feature comprises the preliminary steps of:
  i. forming a dielectric layer on a surface of a substrate, said dielectric layer having an exposed, upper surface;
  ii. forming at least one recess in said exposed, upper surface of said dielectric layer;
  iii. depositing a metal layer filling the at least one recess and extending over said upper surface of said dielectric layer;
  iv. removing the portion(s) of the metal layer extending over said upper surface of said dielectric layer; and
  v. removing any excess thickness portion(s) of the metal layer filling the at least one recess which extend(s) above said upper surface of said dielectric layer, thereby making the upper surface of said at least one in-laid metal feature substantially co-planar with said upper surface of said dielectric layer.

15. The method as in claim 14, wherein:
preliminary step v. comprises planarizing by chemical-mechanical polishing (CMP).

16. A method of manufacturing a semiconductor integrated circuit device, which method comprises the sequential steps of:
(a) providing a substrate comprising a semiconductor wafer of monocrystalline Si or GaAs and having a major surface, a dielectric layer formed on at least a portion of said major surface and having an exposed, upper surface, at least one damascene-type, unalloyed Cu metal feature in-laid in said upper surface of said dielectric layer, the at least one Cu metal feature including an exposed, upper surface substantially co-planar with said upper surface of said dielectric layer;
(b) blanket-depositing at least one layer comprising at least one electromigration reducing alloying element for said Cu metal feature on said exposed, upper surface of said at least one Cu metal feature and on said exposed, upper surface of said dielectric layer, said at least one alloying element being selected from the group consisting of: Sn, B, Mg, C, Pd, Co, Ni, and Cd;
(c) annealing to substantially uniformly diffuse the at least one alloying element into said at least one Cu metal feature for at least a minimum depth below said upper surface thereof, thereby to minimize or substantially prevent electromigration of Cu atoms and/or ions therefrom, the thickness of said at least one layer comprising said at least one alloying element being sufficient to provide a predetermined minimum concentration thereof of from about 0.1 to about 4 at. % for a predetermined minimum depth of at least about 20 Å below said upper surface of said at least one Cu metal feature; and
(d) removing any remaining alloyed and/or unalloyed portion(s) of said at least one layer comprising said at least one alloying element which extend(s) above said upper surface of said dielectric layer, thereby making said upper surface of said at least one Cu metal feature substantially co-planar with said upper surface of said dielectric layer.

17. The method as in claim 16, further comprising the step of:
(a') exposing said upper surface of said at least one Cu metal feature to a reducing agent or atmosphere to reduce any copper oxide present thereat prior to performing step (b).

18. The method as in claim 17, wherein:
step (a') comprises exposing said upper surface of said at least one Cu metal feature to a hydrogen plasma.

19. The method as in claim 16, wherein:
step (c) comprises annealing at a temperature of from about 200° C. to about 450° C. for from about 60 sec. to about 90 min. in an inert atmosphere.

20. The method as in claim 16, wherein:
step (a) comprises providing a semiconductor wafer having a dielectric layer on a major surface thereof which comprises a plurality of in-laid, unalloyed Cu metal features of different widths and/or depths for providing vias, interlevel metallization, and/or interconnection lines of at least one active device region or component formed on or within said semiconductor wafer.

* * * * *